… … … … … … … … … … … … … … … … … … … US005466626A

United States Patent [19]
Armacost et al.

[11] Patent Number: 5,466,626
[45] Date of Patent: Nov. 14, 1995

[54] MICRO MASK COMPRISING AGGLOMERATED MATERIAL

[75] Inventors: Michael Armacost, Wallkill, N.Y.; A. Richard Baker, Jr., Burlington; Wayne S. Berry, Essex Junction, both of Vt.; Daniel A. Carl, Poughkeepsie, N.Y.; Donald M. Kenney, Shelburne, Vt.; Thomas J. Licata, Lagrangeville, N.Y.

[73] Assignee: International Business Machines Corporation, Armonk, N.Y.

[21] Appl. No.: 168,703

[22] Filed: Dec. 16, 1993

[51] Int. Cl.$^6$ .................................. H01L 21/8242
[52] U.S. Cl. .............................. 437/60; 437/52; 437/233; 437/919; 437/971; 148/DIG. 105
[58] Field of Search .................................. 437/47, 48, 52, 437/60, 919, 971, 192, 200, 233; 148/DIG. 105; 156/643; 257/309

[56] References Cited

U.S. PATENT DOCUMENTS

| | | | |
|---|---|---|---|
| 4,671,849 | 6/1987 | Chen et al. | 437/643 |
| 5,102,832 | 4/1992 | Tuttle | 437/231 |
| 5,108,569 | 4/1992 | Giboa et al. | 204/192.13 |
| 5,112,773 | 5/1992 | Tuttle | 437/109 |
| 5,134,086 | 7/1992 | Ahn | 437/52 |
| 5,134,086 | 7/1992 | Ahm | 437/977 |
| 5,149,676 | 9/1992 | Kim et al. | 437/977 |
| 5,169,803 | 12/1992 | Miyakawa | 437/52 |
| 5,240,558 | 8/1993 | Kawasaki et al. | 437/228 |
| 5,254,503 | 10/1993 | Kenney | 437/977 |
| 5,270,263 | 12/1993 | Kim et al. | 437/228 |
| 5,302,540 | 4/1994 | Ko et al. | 437/977 |

FOREIGN PATENT DOCUMENTS 0123279  7/1984  Japan .

OTHER PUBLICATIONS

P. C. Fazan and A. Ditali, "Electrical Characterization of Textured Interpoly Capacitors For Advanced Stacked DRAMs", IEDM #27.5.1–27.5.4, pp. 663–666 (1990).
M. Sakao et al., "A Capacitor–Over–Bit–Line (COB) Cell With A Hemispherical–Grain Storage Node For 64Mb DRAMs", IEDM 27.3.1–27.3.4, pp. 655–658 (1990).
Y. Yoshimaru et al., "Rugged Surface Poly–Si Electrode And Low Temperature Deposited $Si_3N_4$ For 64 MBIT And Beyond STC DRAM Cell", IEDM #27.4.1–27.4.4, pp. 659–662 (1990).

Primary Examiner—Tom Thomas
Attorney, Agent, or Firm—Heslin & Rothenberg

[57] ABSTRACT

The subject invention provides a method of forming recesses in a substrate such as a capacitor so as to increase the surface area thereof and therefore the charge storage capacity of the capacitor. This is accomplished by utilizing a micro mask formed by agglomeration on the surface of the substrate. The agglomerated material, such as gold, titanium nitride or titanium silicide, is used as a mask for selectively etching the substrate to form recesses therein. Alternatively, an oxide transfer mask can be utilized with the agglomerated material micro mask to etch the substrate.

16 Claims, 7 Drawing Sheets

MICRO MASK COMPRISING AGGLOMERATED MATERIAL

TECHNICAL FIELD

This invention relates to methods of forming recesses in a substrate, and more particularly to methods of increasing the surface area of structures used as capacitors by forming such recesses in accessible surfaces of the capacitor.

BACKGROUND ART

The development of the semiconductor industry has always followed that of the Dynamic Random Access Memory (DRAM) technology in that the DRAM development has led to the use of the highest density technology elements capable of being produced in manufacturable quantities. The development of DRAM's in the 4 Megabit (4 Mb) density range began to depart from the twenty year tradition of two-dimensional DRAM designs by the appearance of three-dimensional DRAM cell structures, most notably by the use of trench capacitors. Proposed designs for DRAM cells in the 16 Mb, 64 Mb and higher density range have also included the use of multi-plate or stacked storage capacitor cell designs, see for example the article "3-Dimensional Stacked Capacitor Cell for 16M and 64M DRAMs," by T. Ema et al., International Electron Device Meeting (IEDM), Dec. 11–14, 1988, pp. 592–5, for a description of stacked DRAM cells.

Although the use of stacked cell technology has rendered the processing of DRAMs more complex, such techniques continue to be used extensively, as suggested by the article "A Novel Stacked Capacitor Cell with Dual Plate for 64 Mb DRAMs," by H. Arima et al., 1990 IEDM, paper 27.2, Dec. 9–12, 1990, pp. 651–4.

Although the preceding designers of DRAMs had taken satisfaction in designing DRAMs using the available microlithographic ground rules available to them, designers of 64 Mb DRAMs realized that they would be required to go far beyond the minimum ground rules of about 0.4 micron in order to provide capacitors of sufficient area to meet the requirements of 64 Mb DRAMs. As a result, there have been described several techniques for providing structures including sub-lithographic elements in order to enhance the surface area and, thus, the capacitance of DRAM capacitors by texturing or roughening the surface of polysilicon electrodes used as capacitor plates. For example, M. Sakao et al. describe in their paper at the 1990 IEDM, paper 27.3, pp. 655–8, how deposition of polysilicon at about 550 degrees C. yields hemispherical-shaped grains of polysilicon about 80 nm in diameter. Thus, surface irregularities in the order of about one-fifth that of the minimum lithographically definable feature are formed providing a potential doubling in capacitance per unit area in the plane of the substrate. These surface irregularities can be transferred to the surface of an underlying polysilicon layer by Reaction Ion Etching (RIE). Others, including M. Yoshimaru et al. in their 1990 IEDM paper 27.4, December 9–12, 1990, pp. 659–662, have shown that cylindrical polysilicon grains can be deposited having greater influence on the capacitance per unit surface area.

Surface roughness can be achieved by several methods. For example, partially oxidizing p+ polysilicon conductors leads to enhanced grain size as described in any of the following references: U.S. Pat. No. 4,119,995 to Simko on Oct. 10, 1978 describes a polysilicon roughening method in which wet oxidation and subsequent removal of oxide is used to promote the electrical discharge of a floating gate in a nonvolatile memory device. U.S. Pat. No. 4,314,265 to Simko describes the grain sizes in the range of about 450 Angstroms in width by about 750 Angstroms in height. This surface irregularity is substantially similar to the grain size described by Sakao et al. above. The article by P. C. Fazen et al. describes the preferable use of a silicon nitride layer adjacent to roughened polysilicon for capacitors requiring low leakage.

In addition, the roughening of the surface of polysilicon by the use of an anodic process has also been reported by Sandhu in U.S. Pat. No. 5,068,199 issued Nov. 26, 1991.

Porous silicon can be formed in monocrystalline silicon substrates to provide surface connected pores several times deeper than those of roughened silicon through the use of anodization in the presence of hydrofluoric acid. (See the articles "Microstructure and formation mechanism of porous silicon," by M. I. J. Beale, et al., Applied Physics letters, Jan. 1, 1985, pp. 86–88, and "Selective porous silicon formation in buried P+ layers," by S. S. Tasco, et al., J. Applied Physics 62(10), Nov. 15, 1987.) The porous silicon produced by this anodic process is somewhat similar to the process described above by Simko in that the oxidation process is enhanced along the polycrystalline grain boundaries.

Yet another method has been proposed to provide enhanced surface roughness by T. Mine et al. in the article "Capacitance-Enhanced Stacked-Capacitor with Engraved Storage Electrode for Deep Submicron DRAMs," 21st Conference on Solid State Devices and Materials, Tokyo, 1989, pp. 137–140. Here, particles of photo-resist generated from an unidentified source are suspended in a spin on glass (SOG) film. The SOG is etched selective to the photoresist in order to leave resist particles on the surface of a polysilicon layer. After removal of the SOG, the underlying polysilicon is etched in the presence of the resist particles. While such a technique has potential for eclipsing those using surface roughening alone, it suffers from lack of a manufacturable method. In addition, because particulate sedimentation is relied on, insufficient randomness in distribution of the particles can occur.

While the prior art techniques have addressed the problem of increased capacitance, only minor success has been achieved. The subject invention is directed toward methods for significantly increasing the surface area and the effective capacitance of a given storage plate configuration.

DISCLOSURE OF THE INVENTION

It is an object of the invention to provide a method of forming recesses in a substrate.

It is a further object of the invention to provide enhanced surface area and increased capacitance for such applications as may be required.

Briefly described, the present invention comprises a method of forming recesses in a substrate. A substrate is selected which has a surface thereof, such as a capacitor structure. A pattern of agglomerated material is then formed on the surface of the substrate, and the substrate is selectively etched away using the agglomerated material as a mask. This leaves a substrate with recesses therein, which increases the surface area of the substrate.

The invention is described in the context of a capacitor as the substrate, and the increased surface area allows the storage of greater charges by the capacitor. This is especially desirable for applications in the high density semiconductor industry such as 64 Mb and 256 Mb DRAM applications.

Agglomeration is the "bailing up" or "dewetting" of a previously uniform and continuous film into areas of greater and lesser thickness. In extreme cases, a discontinuous array of islands will remain. Such agglomeration is energetically favored since, in the absence of an ongoing film-substrate chemical reaction, atoms or molecules in a film have a greater bonding affinity for like atoms than for unlike atoms such as those comprising the substrate. The film atoms diffuse to maximize the volume of like material and minimize the total surface area and film/substrate contact, since such interfaces are characterized by energetically unfavorable unbonded or poorly bonded atoms.

In principle, any material having grain boundaries or other high diffusivity paths will agglomerate on some surface if sufficiently heated. This is because a continuous film agglomerates by diffusing material principally along internal high diffusivity paths (grain boundaries between crystals or other such defects), and diffusion is a thermally activated process. Most metals and conductive compounds are crystalline and hence agglomerate more easily than $SiO_2$ or other amorphous (non-crystalline) films. Further, many metals and conductive compounds, especially those having low melting points, agglomerate relatively easily since they have large self-diffusion coefficients. This is not true of $SiO_2$ and other commonly used dielectric substrates. Note that diffusion along free surfaces and interfaces can also be significant in some cases, while lattice diffusion is least significant.

Agglomeration is increasingly severe for thinner films, since thin films have a high ratio of surface area to volume, and are thus far away from the state of lowest energy. Further, diffusing atoms need not diffuse far to decrease their bond energies. In fact, very thin films typically grow by nucleating as thin and discrete "islands", which widen and thicken until they coalesce to form a continuous layer.

Hence, agglomeration as used herein refers to formation of any film which is rendered discontinuous or non-uniform in thickness. However, particular cases of note include thin, heat-treated metals or conductive compounds, and films which are discontinuous "as-grown" (i.e. no thermally-driven agglomeration is required). Specific examples include, but are not limited to, Physical Vapor Deposited (PVD, e.g. sputtered or evaporated) or Chemical Vapor Deposited (CVD):

| | |
|---|---|
| Ti, Cr, Mo, W, Co, Ta, Nb, Al, Cu, Si, C | (elements); |
| $TiSi_2$, $CoSi_2$, $MoSi_2$, NbSi, $WSi_2$ and $TaSi_2$ | (silicides); |
| TiN, TaN, WN, ZrN | (nitrides); |
| $CrB_2$, $HfB_2$, MoB, TiB, ZrB TiW | (borides); |
| $SiO_2$, $Si_3N_4$, SiC, BN | (insulators). |

It is then possible to utilize the agglomerated material directly or indirectly as a mask for selective etching, e.g. reactive ion etching, of the substrate. When used directly, a selective etch is performed using the agglomerated material as a mask and recesses are formed in the substrate. When used indirectly, the uppermost portion of the substrate is an insulation layer (which forms the surface of the substrate). The agglomerated material is formed on the exposed portion of the insulation layer. A first selective etch uses the agglomerated material as a mask to form recesses in the insulation layer. The patterned insulation layer then functions as a mask in a second selective etch to form recesses in the substrate. Thus, the agglomerated material operated indirectly as a masking pattern for etching the substrate, with the insulation layer serving as a transfer mask.

BRIEF DESCRIPTION OF DRAWINGS

The foregoing and other objects, features and advantages of the invention will be apparent from the following more particular description of preferred embodiments of the invention as illustrated in the accompanying drawings in which.

BEST MODE FOR CARRYING OUT THE INVENTION

Figure 1:
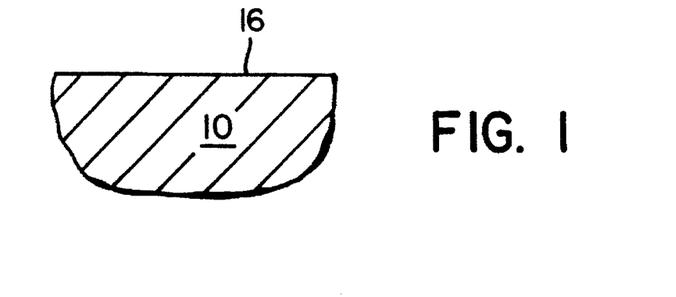
FIG. 1 is a cross-section side elevational view of an initial substrate according to one embodiment of the subject invention.
Figure 2:
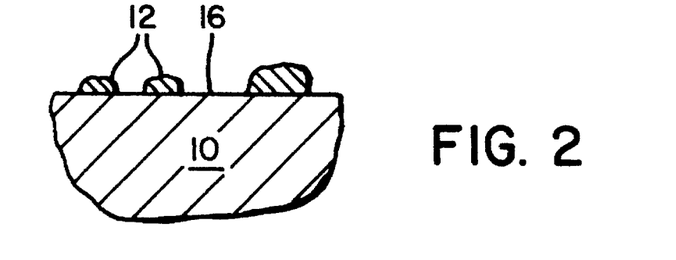
FIG. 2 is a cross-section side elevational view of the substrate shown in FIG. 1 after forming a pattern of agglomerated material on the surface thereof.
Figure 3:
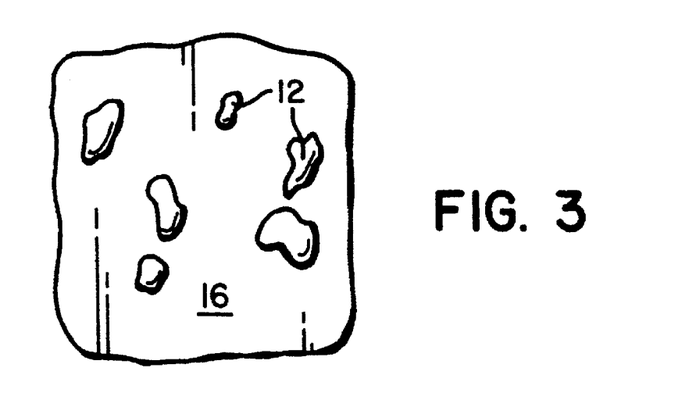
FIG. 3 is a top view of the substrate shown in FIG. 2.

Referring to FIG. 1 there is shown a substrate 10 having a surface 16 thereof which may be of any desired material, but is preferably a semiconductor substrate which may be monocrystalline or polycrystalline in form. The substrate 10 may be an accessible portion of a capacitor, such as a flat capacitor, or accessible portions of a stacked capacitor. Referring to FIGS. 2 and 3, a pattern of agglomerated material 12 is formed on the surface 16 of the substrate 10. Using the agglomerated material 12 as a micro mask (i.e. smaller than the minimum size attainable with conventional lithography/etching techniques), the substrate 10 is selectively etched such as by reactive ion etching. During this etching process to form the recesses 14 in the substrate 10 (see FIG. 4), sputtering by the ions will also result in removal of the agglomerated material that had been formed on the surface of the substrate.

Figure 4:
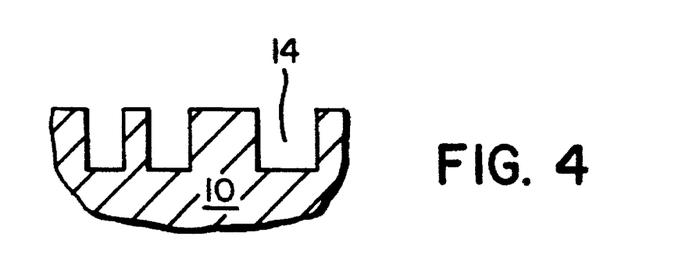
FIG. 4 is a cross-section side elevational view of the substrate shown in FIG. 2 after selective etching using the agglomerated material as a mask, resulting in recesses in the substrate.

Thus, the resulting structure (as shown in FIG. 4) has recesses therein, increasing the surface area of the substrate. In the case of a capacitor, this increase in surface area results in an increased storage capacity while still allowing the desired density of features in the semiconductor device.

Figure 5:
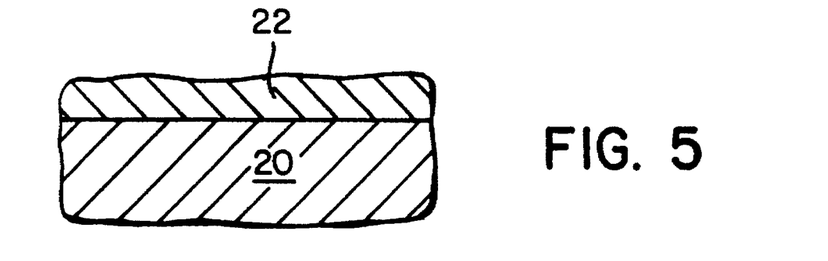
FIG. 5 is a cross-section side elevational view of an initial substrate according to another embodiment of the subject invention in which the upper portion of the substrate comprises an insulation layer.
Figure 6:
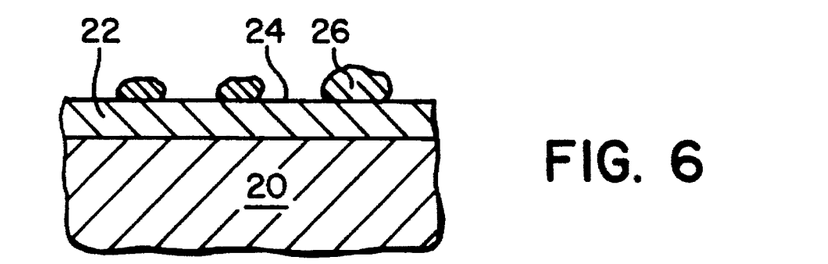
FIG. 6 is a cross-section side elevational view of the substrate shown in FIG. 5 after forming a pattern of agglomerated material on the surface of the insulation layer.
Figure 7:
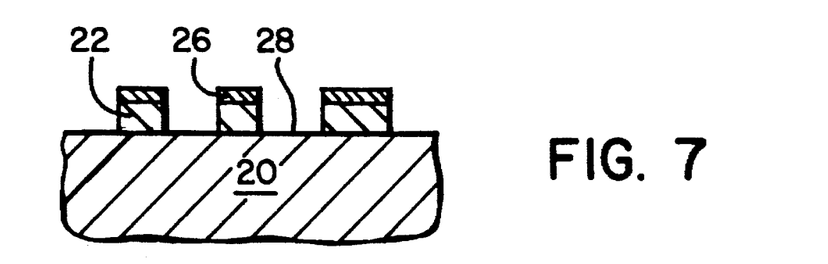
FIG. 7 is a cross-section side elevational view of the substrate shown in FIG. 6 after selective etching of the insulation layer using the agglomerated material as a mask, resulting in recesses in the insulation layer.
Figure 8:
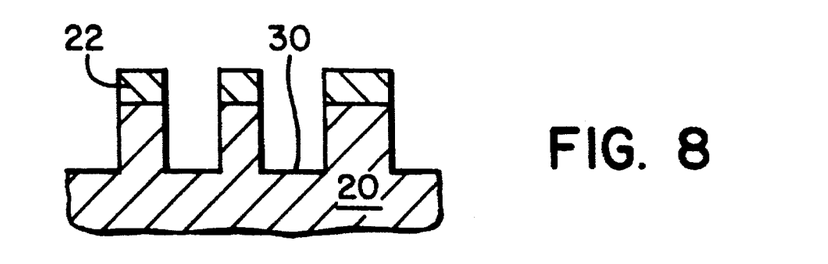
FIG. 8 is a cross-section side elevational view of the substrate shown in FIG. 7 after selective etching of the substrate using the etched insulation layer as a mask, resulting in the removal of the agglomerated material and the formation of recesses in the substrate.

Referring to FIG. 5, an alternate embodiment of the subject invention is shown in which a substrate 20 included an insulation layer 22. Agglomerated material 26 is formed on the surface 24 of the insulation layer 22 as shown in FIG. 6. The selective etch comprises two steps. The first etch, as shown in FIG. 7, utilizes the agglomerated material 26 as a micro mask to selectively etch the insulation layer 22 resulting in recesses 28 therein. The second etch, as shown in FIG. 8, utilizes the etched insulation layer 22 as a micro mask to selectively etch the substrate 20 resulting in recesses 30 therein.

Figure 9:
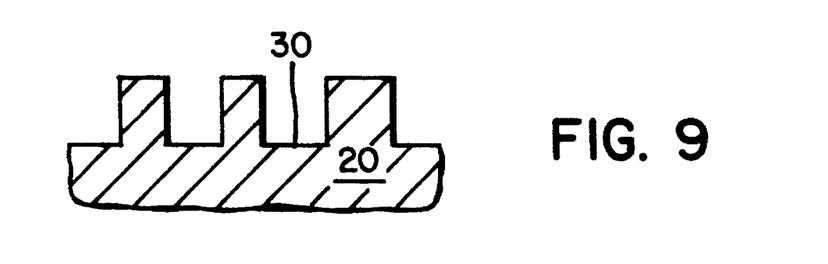
FIG. 9 is a cross-section side elevational view of the substrate shown in FIG. 8 after removal of the remaining insulation layer.

This etch may also remove the agglomerated material due to sputtering. In the event that all of the agglomerated material is not removed, any suitable method of removal may be utilized such as reactive ion etching. As shown in FIG. 9, the insulation layer 22 has also been removed by suitable means (such as reactive ion etching) to leave only the substrate 20 with recesses 30 therein.

As with the structure shown in FIG. 4, the structure shown in FIG. 9 has increased surface area that results in increased storage capacity in a capacitor structure.

These features of the subject invention will be more apparent when read in conjunction with the following examples.

EXAMPLE I

Demonstration of Micromasking on Unpatterned Wafers

The goal of the first experiment was to identify materials and deposited thicknesses that provide useful agglomerated feature sizes. TiN (titanium nitride), $TiSi_2$ (titanium silicide), Si (silicon) and $Si_3N_4$ (silicon nitride) films were sputter-deposited in a Varian M2000 cluster tool (Varian Associates, Palo Alto, Calif.), though many different tools would suffice. 50 Å, 100 Å and 150 Å film thicknesses were utilized. Bare Si wafers and wafers with 5 kÅ-thick blanket oxide film were the evaluation vehicles. In all cases, the deposition power was reduced to ⅕–⅓ that normally used to provide better thickness control and uniformity. Typical deposition times were 5–15 seconds. The deposition temperatures were 150° C. For TiN and $TiSi_2$, x-ray fluorescence thickness measurement was used, while for Si and $Si_3N_4$ films, thicknesses were extrapolated by time from thicker films measured by ellipsometry.

Figure 10:
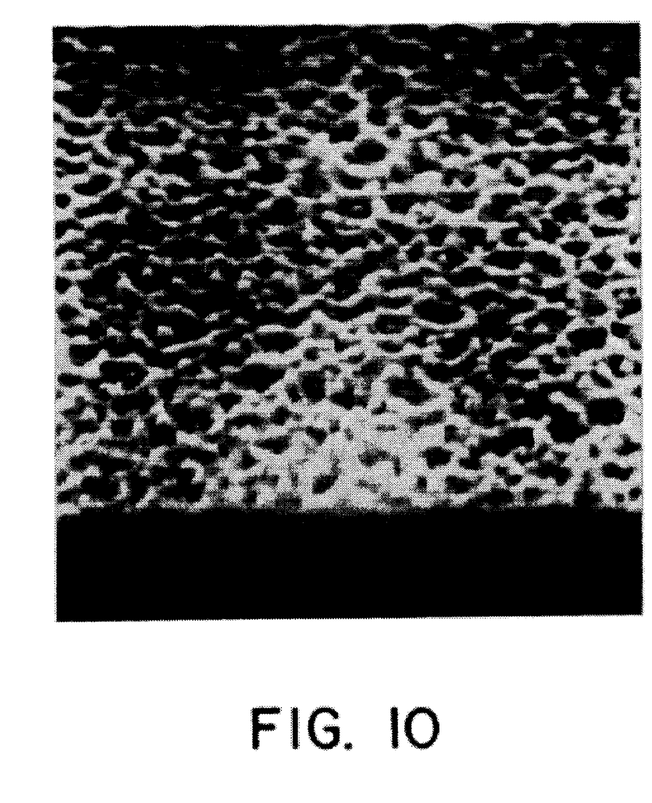
FIG. 10 is an isometric view of features resulting from deposition of 50 Å TiN followed by a 2 kÅ oxide etch.
Figure 11:
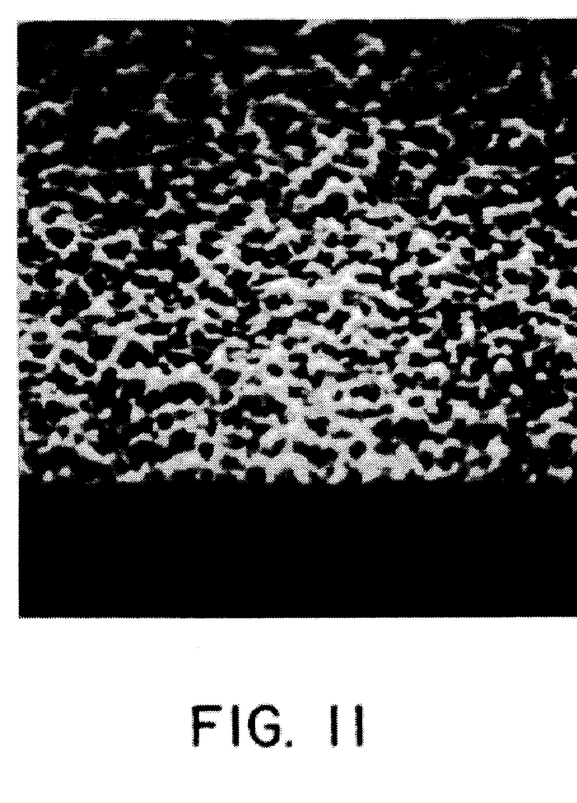
FIG. 11 is an isometric view of features resulting from deposition of 50 Å $TiSi_2$ followed by a 1 kÅ oxide etch.

Films were deposited on bare Si wafers and analyzed by Scanning Electron Microscopy (SEM) with no further processing. Oxide-covered wafers were deposited on and then exposed to an in situ oxide etch for times equivalent to removal of 1 kÅ or 2 kÅ $SiO_2$ (silicon dioxide). The in situ etch parameters are described in Table 1. Regardless of the deposited material, SEM could not visualize agglomerated features on bare Si. However, TiN or $TiSi_2$-coated oxide wafers exposed to the in situ oxide etch displayed micromasked features. FIGS. 10 and 11 show the best examples of micromasking obtained in this experiment. FIG. 10 shows features resulting from deposition of 50 Å TiN followed by a 2 kÅ oxide etch, while FIG. 11 shows features resulting from deposition of 50 Å $TiSi_2$ followed by 1 kÅ oxide etch. Note that the 100 Å and 150 Å depositions typically yielded much larger agglomerated features not useful for capacitor texturing. Further, in the case of 50 Å $TiSi_2$ followed by 2 kÅ oxide etch, the resulting features were on the same lateral scale as the 1 kÅ oxide etch, though significantly shallower. This result was also observed to a lesser extent on TiN films and suggests that prolonged etch times can erode the mask and micromasked features.

Neither Si nor $Si_3N_4$-coated wafers displayed such features. This result along with separate experiments unrelated to micromasking lead to the conclusion that these films do not spontaneously agglomerate on oxide under these deposition conditions.

EXAMPLE II

Fabrication of Large Enhanced Area Capacitors

In the second experiment, the two best processes identified above were applied to forming large (196,000 $\mu m^2$), electrically testable, enhanced area capacitors using the mask set.

5000 Å of $SiO_2$ was deposited to isolate the devices to be formed later. This layer was masked and etched down to silicon. Capacitors were formed on this exposed silicon. First, 5000 Å of N+ polysilicon was deposited to form the lower capacitor plate. A 500 Å-thick $SiO_2$ (TEOS) layer was deposited to form the micromask transfer mask. 50 Å-thick TiN or $TiSi_2$ layers were deposited to form the agglomerated micromask. The agglomerated pattern was transferred into the oxide layer and polysilicon using dry oxide and/or polysilicon etches. Remaining agglomerated material and TEOS were stripped, leaving a textured Si lower capacitor plate. A 70 Å-thick nitride-oxide node dielectric was formed using rapid thermal annealing. A 5000 Å-thick N+ polysilicon upper plate was deposited. A 3000 Å-thick TEOS overlayer was deposited. A photo lithographic mask was used to define the upper capacitor plate. After etching the plate boundaries and removing the resist, the upper plate sidewalls were oxidized, and silicon nitride sidewall spacers were formed to ensure electrical isolation of the upper plates. Finally, Al was deposited on the wafer backs and annealed to provide electrical contact to the bottom capacitor plate.

Table 1 shows details of the etches used on the micromasked samples. In brief, a short $SiO_2$ RIE (reactive ion etch) process was used for ex situ oxide etch, while a short polysilicon etch process was used for ex situ polysilicon etch. Several of the wafers were cross-sectioned and analyzed to guide etch development. In all cases it was determined that the oxide etch processes had no discernable effect. Residual TiN or $TiSi_2$ between the agglomerated islands visible to SEM may have prevented the etching. Accordingly, only the ex situ polysilicon etch was used on the product wafers.

Figure 12:
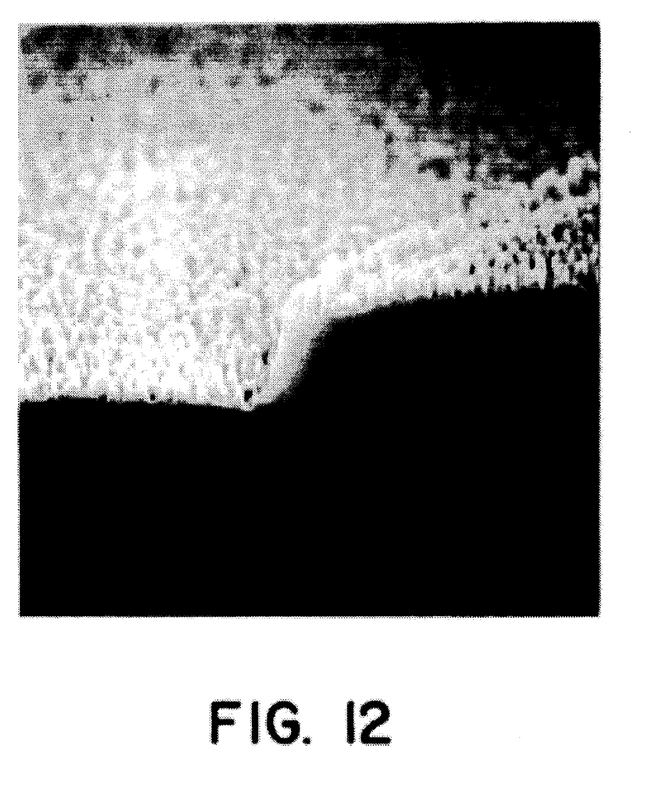
FIG. 12 is an isometric view of the features resulting from the TiN/ex situ oxide etch split.
Figure 13:
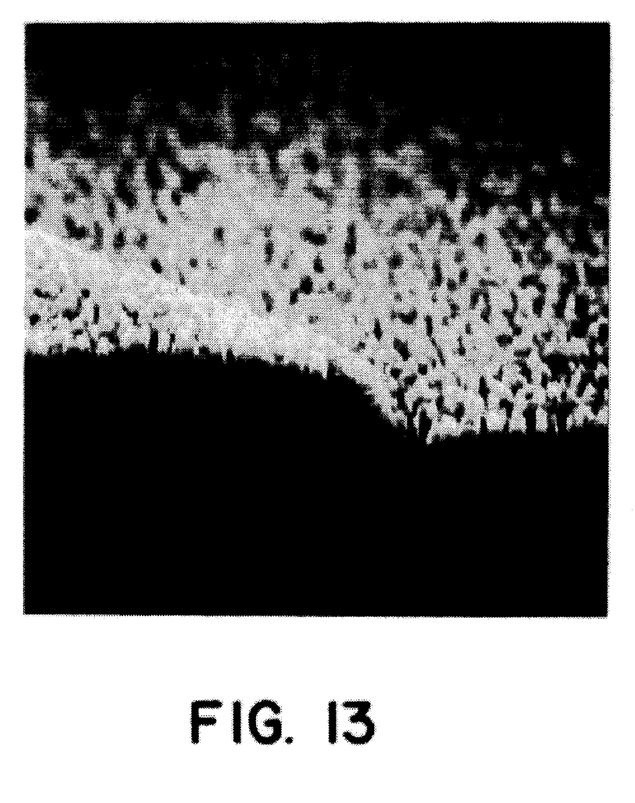
FIG. 13 is an isometric view of the features resulting from the TiN/in situ oxide etch split.
Figure 14:
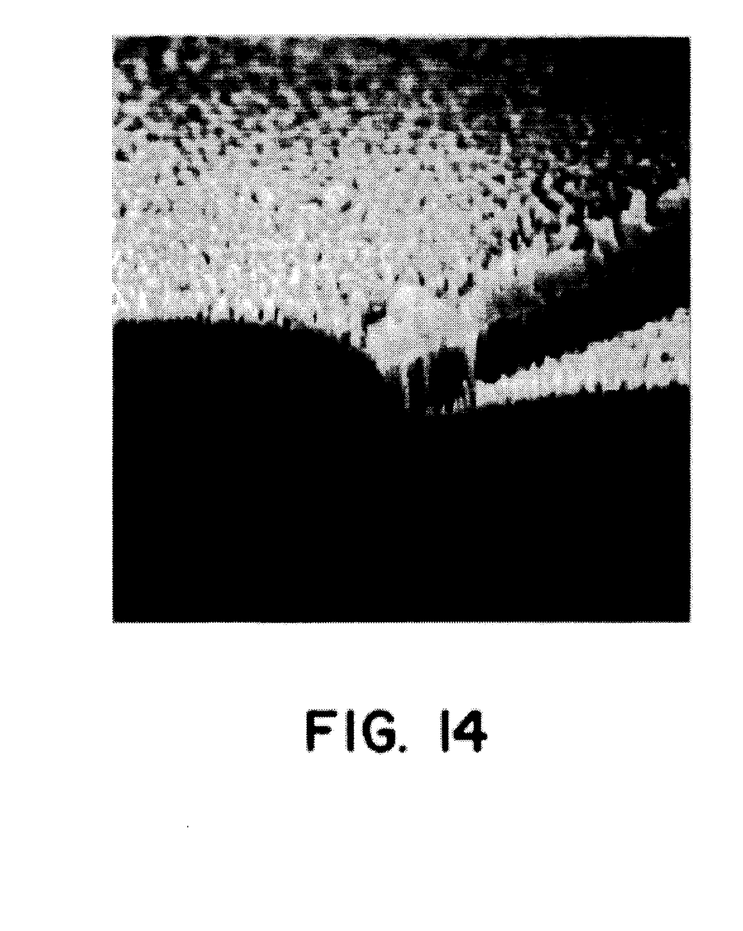
FIG. 14 is an isometric view of the features resulting from the $TiSi_2$/ex situ oxide etch split.
Figure 15:
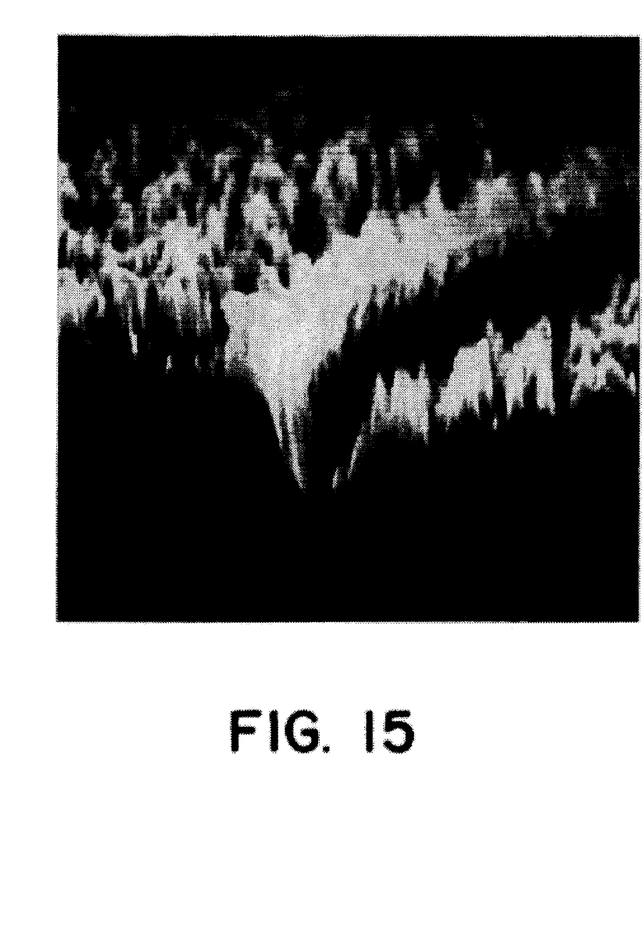
FIG. 15 is an isometric view of the features resulting from the $TiSi_2$/in situ oxide etch split.

For the TiN/ex situ oxide etch split, the best process was determined to be ex situ polysilicon etch for 120 seconds. This left 3000 Å of polysilicon having 2000 Å-tall micromasked features (FIG. 12). This was also true for the TiN/in situ oxide etch split, and resulted in 5500 Å of polysilicon having 2000 Å-tall micromasked features (FIG. 13). For the TiSi$_2$/ex situ oxide etch split, the best process was determined to be ex situ polysilicon etch for 100 seconds. This left 4000 Å of polysilicon having 2000 Å-tall micromasked features (FIG. 14). This was also true for the TiSi$_2$/in situ oxide etch split, and resulted in 4000 Å of polysilicon having almost 4000 Å-tall micromasked features (FIG. 15). Based on this result, this last split was expected to show the largest capacitance enhancement.

Figure 16:
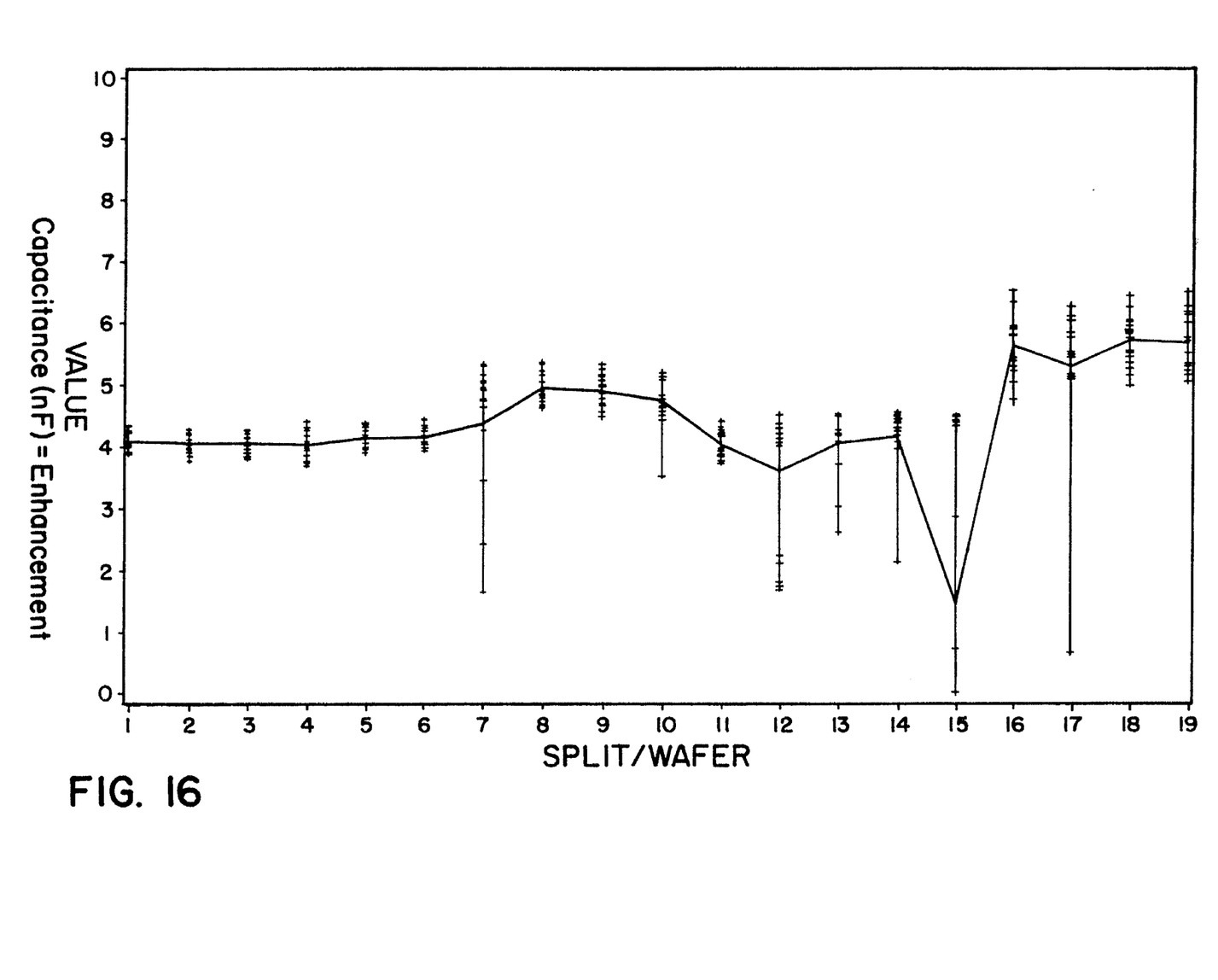
FIG. 16 shows the capacitance in nF versus the wafer number for the splits outlined in Table 2.
Figure 17:
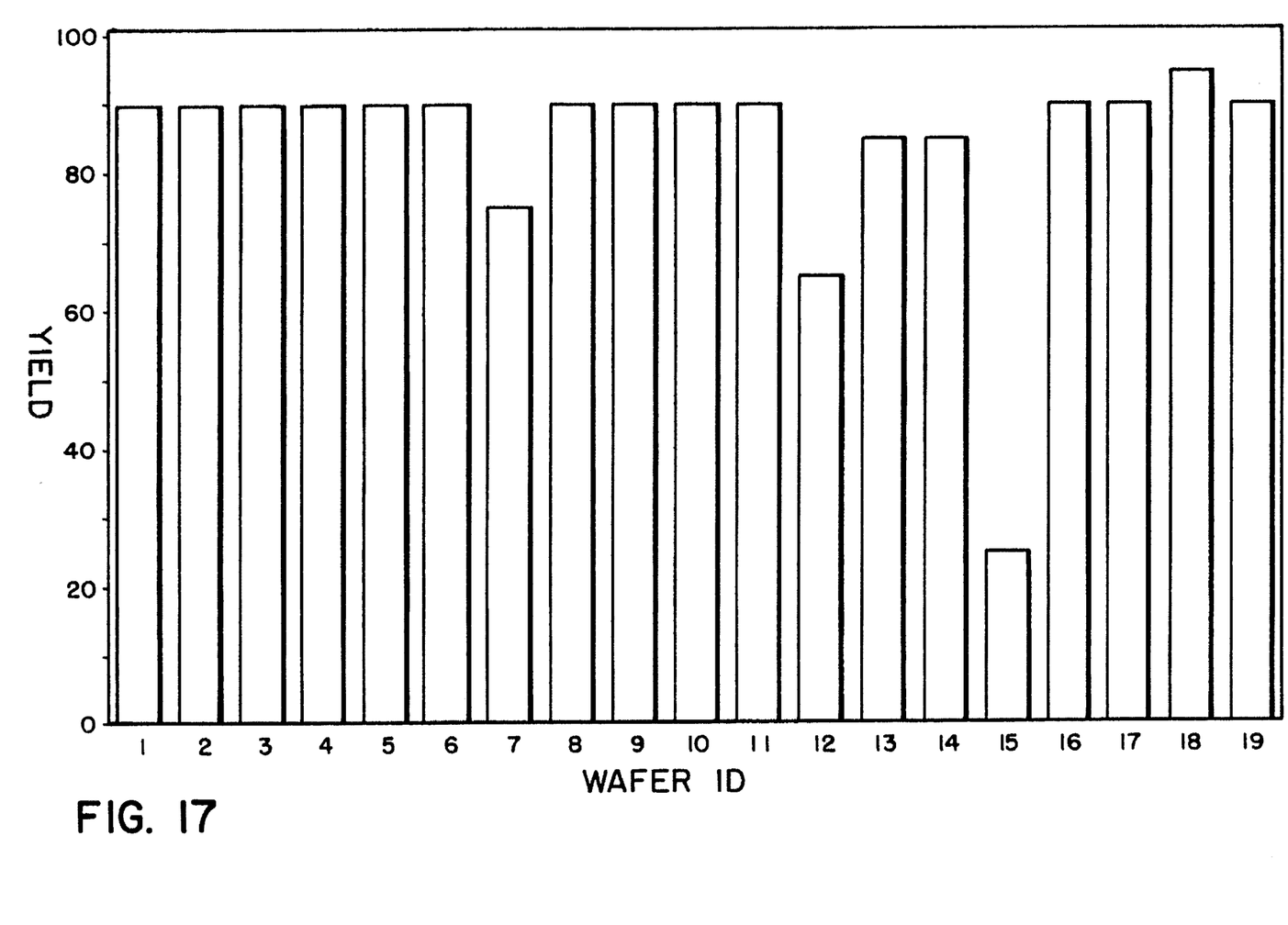
FIG. 17 shows the yield in % versus the wafer number for the splits outlined in Table 2.

Following processing, the devices were electrically tested for capacitance. The following results correspond to 1 kHz probe frequency at 1.5 V. FIG. 16 shows capacitance in nF vs wafer number. Wafer numbers 1–6 correspond to the 50 Å TiN/no oxide etch split shown in Table 2. Wafer numbers 7–10 correspond to the 50 Å TiN/in situ oxide etch split shown in Table 2. Wafer numbers 11–15 correspond to the 50 Å TiSi$_2$/no oxide etch split shown in Table 2. Wafer numbers 16–19 correspond to the 50 Å TiSi$_2$/in situ oxide etch split shown in Table 2. Since planar capacitors fabricated in this manner yield 1 nF, the capacitance is equal to the enhancement factor over planar capacitors. FIG. 17 shows the yield obtained for each wafer number for this test. The results for both of these parameters are summarized in Table 2.

Measurement of breakdown voltage was performed on a small number of capacitors. These breakdown voltages ranged from 5–8 V, values generally consistent with a 60–70 Å thick node dielectric. Further, the 50 Å TiSi$_2$/in situ oxide etch split appeared somewhat leaky as compared to the other splits. This correlates with the largest amount of enhanced capacitance and the aforementioned highest aspect ratio spires, and may indicate an upper bound on the useful spire aspect ratio with a nitride-oxide dielectric.

As shown, the method of the subject invention can be used to form high surface area capacitors by micromasked etching of a poly plate before node dielectric deposition. The micromask is formed by spontaneously agglomerated TiN and TiSi$_2$ films, for example, which provide etch selectivity to an underlying substrate or oxide transfer mask film. This method can be used to fabricate with high yield large, 4–6×enhanced area capacitors having good breakdown and leakage characteristics. The micromasked feature sizes obtained may be useful for the 256 Mb DRAM, but are certainly small enough to be useful for the 64 Mb DRAM.

The subject invention has been described in the context of capacitors and the semiconductor industry. The invention can be equally applicable to other technologies which can benefit therefrom. For example, it may be possible to utilize agglomerated material as a mask for roughening a smooth surface such as metal prior to painting, or roughening the smooth surface of a tool prior to applying a hardness coating of titanium nitride.

While the invention has been particularly shown and described with reference to preferred embodiments thereof, it will be understood by those skilled in the art that various charges in form and details may be made therein without departing from the spirit and scope of the invention.

TABLE 1

| PARAMETER | UNIT | IN SITU ETCH | SiO$_2$ RIE | PolySi RIE |
|---|---|---|---|---|
| Module | — | M2000/TEL | AME5031A | AME5072A |
| Material | — | SiO$_2$ | SiO$_2$ | Poly-Si |
| Etch Rate | Å/s | 77 | 6 | 58 |
| Cl$_2$ flow | SCCM | — | — | 40 |
| HCl flow | SCCM | — | — | 10 |
| CF$_4$ | SCCM | 5 | — | — |
| CHF$_3$ flow | SCCM | 40 | 75 | — |
| O$_2$ | SCCM | 10 | — | — |
| 30% O$_2$/He flow | SCCM | — | 10 | — |
| Ar | SCCM | 60 | — | — |
| Pressure | mT | 200 | 115 | 10 |
| RF Power | W | 800 | 175 | 200 |
| Magnetic Field | G | 100 | 77.8 | 40 |
| Temperature | °C. | 20 | 20 | 20 |

TABLE 2

| Split | # Wafers | Mean Area Enhancement | Yield |
|---|---|---|---|
| 50 Å TiN/No Oxide Etch | 6 | 4.1 | 90% |
| 50 Å TiN/In Situ Oxide Etch | 4 | 4.8 | 90% |
| 50 Å TiSi$_2$/No Oxide Etch | 5 | 4.0 | 79% |
| 50 Å TiSi$_2$/In Situ Oxide Etch | 4 | 5.6 | 93% |

What is claimed is:

1. A method of forming recesses in a substrate, said method comprising the steps of:

selecting a substrate having a surface thereof;

sputter depositing a pattern of agglomerated material, which comprises a compound conductor, on said surface of said substrate; and selectively etching said substrate using said agglomerated material as a mask so as to form recesses in said substrate.

2. The method of claim 1 wherein said substrate comprises a flat capacitor.

3. The method of claim 1 wherein said substrate comprises a stacked capacitor.

4. The method of claim 1 wherein said substrate comprises a silicon wafer.

5. The method of claim 1 wherein said substrate comprises a silicon wafer with an insulator layer overlying said silicon wafer, said insulator layer being exposed on an upper surface thereof and said surface of said substrate comprising said upper surface of said insulator layer.

6. The method of claim 5 wherein said selective etch comprises:

first selectively etching said insulator layer using said agglomerated material as a mask so as to form recesses in said insulator layer; and second selectively etching said substrate using said etched insulator layer as a mask so as to form recesses in said substrate.

7. The method of claim 5 wherein said insulator layer comprises an oxide layer.

8. The method of claim 7 wherein said oxide comprises silicon dioxide.

9. The method of claim 1 wherein said pattern comprises a random pattern.

10. The method of claim 1 wherein said compound conductor comprises titanium nitride.

11. The method of claim 1 wherein said compound conductor comprises titanium silicide.

12. The method of claim 1 wherein said selective etch of said substrate comprises reactive ion etching.

13. The method of claim 1 further comprising removing said agglomerated material from said surface.

14. The method of claim 13 wherein said agglomerated material is removed during said selective etch.

15. The method of claim 14 wherein sputtering during said selective etch removes said agglomerated material.

16. The method of claim 1, wherein the compound conductor is a silicide or a nitride.

* * * * *